| (12) | United States Patent | (10) Patent No.: | US 7,068,371 B2 |
|---|---|---|---|
| | Goo | (45) Date of Patent: | Jun. 27, 2006 |

(54) METHODS AND APPARATUS FOR ALIGNING A WAFER IN WHICH MULTIPLE LIGHT BEAMS ARE USED TO SCAN ALIGNMENT MARKS

(75) Inventor: Doo-Hoon Goo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 469 days.

(21) Appl. No.: 10/606,050

(22) Filed: Jun. 25, 2003

(65) Prior Publication Data

US 2004/0002172 A1    Jan. 1, 2004

(30) Foreign Application Priority Data

Jun. 26, 2002    (KR)    ................ 2002-36013

(51) Int. Cl.
 *G01B 11/00* (2006.01)
(52) U.S. Cl. .................................. 356/401; 356/400
(58) Field of Classification Search ........ 356/399–401, 356/614; 430/22
See application file for complete search history.

(56) References Cited

U.S. PATENT DOCUMENTS 5,000,573 A * 3/1991 Suzuki et al. ............... 356/490
5,313,272 A * 5/1994 Nose et al. .................. 356/614
5,610,718 A * 3/1997 Sentoku et al. ............. 356/490
5,751,426 A * 5/1998 Nose et al. .................. 356/488
5,906,901 A   5/1999 Tanimoto ..................... 430/22
6,154,281 A * 11/2000 Sentoku et al. ............. 356/401
6,667,806 B1 * 12/2003 Yoshitake et al. .......... 356/399

FOREIGN PATENT DOCUMENTS

JP        4237114       8/1992
JP        07260424    * 10/1995
KR        00160544 B1   8/1998

* cited by examiner

*Primary Examiner*—Layla G. Lauchman
(74) *Attorney, Agent, or Firm*—Myers Bigel Sibley & Sajovec, P.A.

(57) ABSTRACT

A wafer, having alignment marks formed thereon, is aligned by radiating a first light beam onto the alignment marks so as to generate a first diffracted light beam. The first diffracted light beam is sensed at a first position. A second light beam is radiated onto the alignment marks so as to generate a second diffracted light beam. The second diffracted light beam is sensed at a second position. A correction value is calculated based on a first difference between the first position and a first predetermined position and a second difference is calculated based on a second difference between the second position and a second predetermined position. The wafer is aligned based on the correction value.

21 Claims, 5 Drawing Sheets

METHODS AND APPARATUS FOR ALIGNING A WAFER IN WHICH MULTIPLE LIGHT BEAMS ARE USED TO SCAN ALIGNMENT MARKS

RELATED APPLICATION

This application claims the benefit of Korean Patent Application No. 2002-36013, filed Jun. 26, 2002, the disclosure of which is hereby incorporated herein by reference.

FIELD OF THE INVENTION

The present invention relates generally to manufacturing integrated circuit devices and, more particularly, to aligning integrated circuit device wafers.

BACKGROUND OF THE INVENTION

To improve competitiveness in the semiconductor industry, unit processes capable of improving the yield of a semiconductor device have been developed. In addition, studies related to methods and apparatus for measuring process errors in each unit process have been actively pursued. The photolithography process is typically a main semiconductor manufacturing process. During a photolithography process, conditions may be varied. Accordingly, manufacturers may develop a process for controlling the variation of the photolithographic process conditions and an apparatus for performing the variation control process.

A problem that may be considered when performing a photolithographic process is misalignment of a photoresist pattern that is formed through exposure and development processes. As a semiconductor device may be highly integrated, an alignment margin generally decreases and a wafer size increases, which may make a precise alignment very difficult. Thus, photoresist pattern misalignment may be problematic in semiconductor manufacturing.

A conventional photolithographic process will now be described. First, a photoresist film is spin-coated on a wafer. Then, a coordinate value of an alignment mark, which has been formed through a photolithographic process, is read out in an exposure device by checking an intensity variation of diffracted light caused by a laser having a monochromatic light beam, or by checking a difference in darkness created by a broadband white light beam. Thereafter, a compensating value for correcting the coordinate value is calculated so as to precisely align the wafer to a predetermined position.

FIG. 1 illustrates a conventional wafer aligning apparatus. A method for aligning the wafer by using the alignment mark will be now be described with reference to FIG. 1. The wafer W coated with a photoresist film is loaded on a wafer stage 10. In the wafer W, a scribe line area is provided between chips and the alignment marks and overlay marks are formed in the scribe line area. Light 12 is radiated onto the wafer in a direction vertical to the alignment marks formed in the wafer W. At this time, the light 12 is continuously radiated onto the alignment marks, which are provided in the form of plural diffraction gratings. The radiated light 12 is diffracted by the alignment marks and a primary light or a secondary light of the diffracted light 14 is sensed. The sensed diffracted light 14 is displayed as a DC signal waveform that is obtained by photoelectrically converting sensed diffracted light 14. A position coordinate of the alignment marks is obtained from the signal waveform. The position of the alignment marks formed at each area of the wafer W is also detected through the above procedures.

Then, the position coordinate of the alignment mark, which is preset when designing the alignment marks, is compared with the position coordinate of the alignment mark obtained through the above procedures to align the wafer W to a relatively precise position.

After aligning the wafer W as discussed above, light, including ultraviolet ray, electronic-beam, or X-ray is radiated onto the photoresist film so as to selectively expose the photoresist film. Then, the photoresist film is patterned through a development process. Thereafter, it is determined whether or not the pattern formed in a present step is identical to the pattern formed in a former step by using an overlay key of an overlay measuring apparatus.

A measuring result of an overlay is then read out. If a measured overlay value is "spec-in," a next procedure, such as an etching procedure, is carried out. If the measured overlay value is "spec-out," a compensating value for correcting the misalignment is calculated and the exposure and development procedures are carried out again. If, however, the wafer W is aligned by radiating light 12 onto the alignment marks as described above, steps of the alignment marks may be evenly distributed over the whole area of the wafer to precisely align the wafer W. If the steps in each pattern of the alignment marks are different at different areas of the wafer W, then a measured position coordinate of the alignment marks of the wafer W is different from a real position coordinate of the alignment marks of the wafer W.

FIG. 2 illustrates sensing positions of the diffracted light according to the steps of the alignment marks in a conventional aligning apparatus. Referring now to FIG. 2, when the alignment marks 20 formed in the wafer W are positioned at the same coordinate, if the alignment marks 20 have different heights by an amount ΔZ, a sensing position of the diffracted light diffracted by an alignment mark 20a having a relatively high height is different from a sensing position of diffracted light diffracted by an alignment mark 20b having a relatively low height. In more detail, the sensing position of the diffracted light diffracted by an alignment mark 20b having a relatively low height is shifted in a positive (+) direction by an amount ΔX as compared with the sensing position of diffracted light diffracted by an alignment mark 20a having a relatively high height. That is, position errors may be incurred due to step differences of the alignment marks.

Step differences may be created when performing a chemical mechanical polishing (CMP) process, which is a common semiconductor manufacturing process. Because the CMP process planarizes an entire surface of the wafer, the alignment marks may be polished or damaged through the CMP process. In addition, if the entire surface of the wafer is unevenly polished, a height difference between patterns included in the alignment marks may become greater at each area of the wafer.

In addition, when a higher-order diffracted light is sensed from the diffracted light diffracted by the alignment marks, an angle between a vertically radiated light and the sensed higher-order diffracted light may increase. Accordingly, the position of the alignment marks measured by higher-order diffracted light may have a significant error. Thus, if the wafer is aligned according to the position coordinate of the alignment marks measured based on the sensing position of diffracted light, then the wafer may not be precisely aligned.

According to the procedures described above, a wafer is aligned by radiating light in a direction vertical to the alignment marks formed in the wafer. It is also possible, however, to align a wafer by slantingly radiating light onto the alignment marks. Japanese Laid-Open Patent Publication No. 4-237114 discloses a method and an apparatus for controlling light transmission by slantingly radiating an aligning light beam onto diffraction gratings of a mask and a wafer. In addition, Japanese Laid-open Patent Publication No.62-058628 discloses a method for aligning a position by radiating light beams having wavelengths of different frequencies.

SUMMARY OF THE INVENTION

According to some embodiments of the present invention, a wafer, having alignment marks formed thereon, is aligned by radiating a first light beam onto the alignment marks so as to generate a first diffracted light beam. The first diffracted light beam is sensed at a first position. A second light beam is radiated onto the alignment marks so as to generate a second diffracted light beam. The second diffracted light beam is sensed at a second position. A correction value is calculated based on a first difference between the first position and a first predetermined position and a second difference is calculated based on a second difference between the second position and a second predetermined position. The wafer is aligned based on the correction value.

In other embodiments of the present invention, the first light beam is vertically radiated onto the wafer.

In still other embodiments of the present invention, the second light beam is radiated at an incident angle of about 0° to about 90° with respect to the wafer.

In further embodiments of the present invention, the correction value is calculated by determining first and second scaling factors. The first difference is multiplied by the first scaling factor to generate a first product. The second difference is multiplied by the second scaling factor to generate a second product. The first and second products are added together to calculate the correction value.

In still further embodiments of the present invention, the first and second scaling factors are determined by calculating respective values for the first and second scaling factors such that adding the first and second products results in a value of zero when the alignment marks are substantially the same height.

In other embodiments of the present invention, radiating the first light beam comprises moving the first light beam along the alignment marks.

In still other embodiments of the present invention, radiating the second light beam comprises moving the second light beam along the alignment marks in a same direction that the first light beam is moved along the alignment marks.

In further embodiments of the present invention, the first and/or the second light beam comprise one or more of an He—Ne, Ar, KrF, ArF, $F_2$, and X-ray light beam.

Although embodiments of the present invention have been described above primarily with respect to method aspects of the present invention, it will be understood that the present invention may also be embodied as apparatus for aligning a wafer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
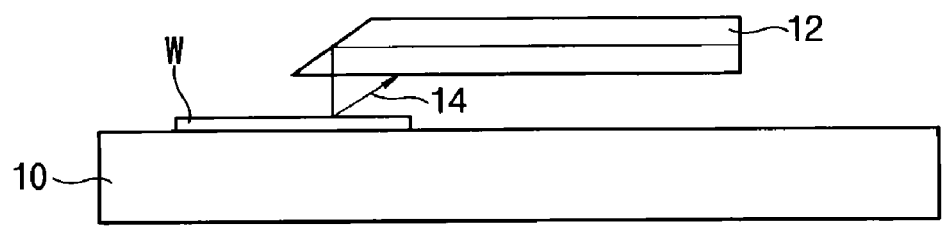
FIG. 1 is a schematic of a conventional wafer alignment apparatus.
Figure 2:
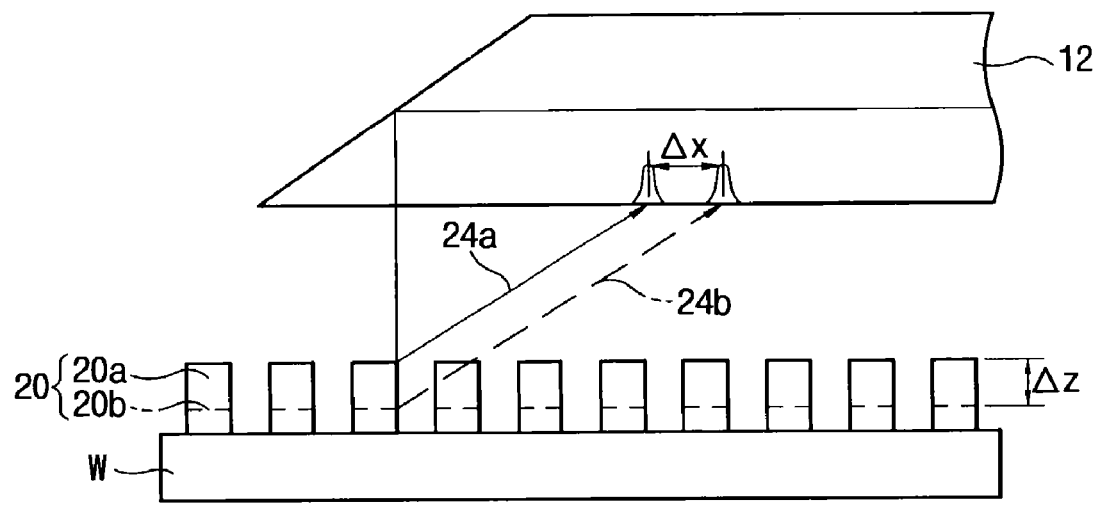
FIG. 2 is a diagram that illustrates sensing positions of a diffracted light beam generated by a conventional wafer alignment apparatus.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

Figure 3:
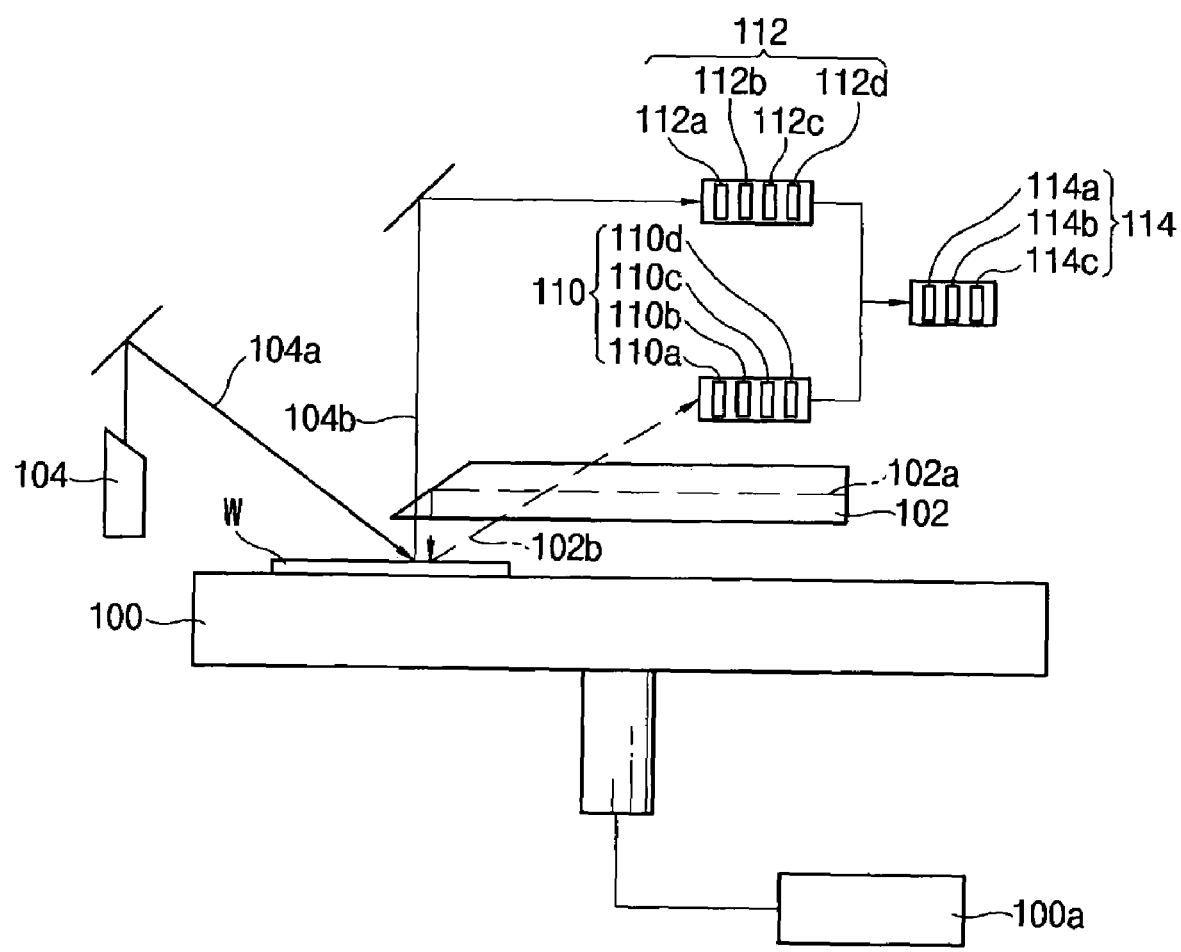
FIG. 3 is a schematic of a wafer alignment apparatus in accordance with some embodiments of the present invention.

FIG. 3 is a schematic view of a wafer alignment apparatus according to some embodiments of the present invention. Referring now to FIG. 3, the wafer aligning apparatus comprises a stage 100 on which a wafer W is mounted. The stage 100 is movable in the X, Y and Z directions by using driving component 100a. In addition, the stage 100 may be horizontally rotated about a center of the stage 100 by the driving component 100a.

A first light source component 102 is provided to radiate a first light beam 102a onto the upper surface of the wafer W and in a direction vertical to the upper surface of the wafer W. The first light source component 102 is connected to a conveying component (not shown) to scan the first light beam 102a onto alignment marks formed on the wafer. The first light source component 102 may generate He—Ne, Ar, KrF, ArF, $F_2$, and X-ray light beams. The first light 102a that is vertically incident onto the wafer is diffracted by the alignment marks formed on the wafer W so that the first light beam is scattered into 0 to $N_{th}$-order diffracted light that form a predetermined angle with respect to the first light beam 102a.

A first sensing component 110 is provided to detect a first position coordinate in the wafer, at which the first light beam 102a is diffracted, by sensing a first diffracted light beam 102b derived from the first light beam 102a diffracted by the wafer. The first sensing component 110 comprises a first sensor 110a, a photoelectric device 110b, a display 110c, and a position calculating component 110d. The first sensor 110a selectively senses the first diffracted light beam, which forms a predetermined angle with the first light beam 102a. That is, the first sensor 110a senses the primary diffracted light beam from the diffracted light beam. The photoelectric device 110b photoelectrically converts the first diffracted light beam sensed by the first sensor 110a. In addition, the display 110c displays the intensity of the converted light beam as a DC signal waveform. The calculating component 110d calculates the first position coordinate of the alignment marks from the DC signal waveform.

A second light source component 104 is provided to supply a second light beam 104a. The second light beam 104a has an incident angle of about 0° to about 90° with respect to the upper surface of the wafer. The second light source component 104 may generate He—Ne, Ar, KrF, ArF, $F_2$, and X-ray light beams. The second light beam 104a that is incident onto the wafer is diffracted by the alignment marks formed in the wafer W, so that the second light beam 104a is scattered into 0 to $N_{th}$-order diffracted light beams forming a predetermined angle with respect to the second light beam 104a.

A second sensing component 112 is provided to detect a second position coordinate in the wafer at which second light 104a is diffracted by sensing the second diffracted light beam 104b, which is derived from the second light beam 104a diffracted by a predetermined alignment mark. The second sensing component 112 comprises a second sensor 112a, a photoelectric device 112b, a display 112c, and a position calculating component 112d. The second sensor 112a selectively senses the second diffracted light beam 104b that forms a predetermined angle with the diffracted light of the second light beam 104a. The photoelectric device 112b electrically converts the second diffracted light beam sensed by the second sensor 112a. In addition, the display 112c displays the intensity of the converted light as a DC signal waveform. The calculating component 112d calculates the second position coordinate of the alignment marks from the DC signal waveform.

The photoelectric device 110b, the display 110c, and the position calculating component 110d of the first sensing component 110 may be used in the second sensing component 112 without the photoelectric device 112b, the display 112c, and the position calculating component 112d of the second sensing component 112, in accordance with some embodiments of the present invention.

A position correcting component 114 is provided to calculate a correcting value for correcting an error caused by steps formed at a surface of the wafer. The position correcting component 114 receives the first and second position coordinates measured by the first and second sensing components 110 and 112, and corrects the error by using a difference between the first and second position coordinates and predetermined position coordinates.

The position correcting component 114 comprises a memory 114a for storing a predetermined position coordinate of the alignment mark, which is obtained when the wafer W is precisely aligned. In addition, the position correcting component 114 comprises a displacement difference calculating component 114b, which receives the first and second position coordinates calculated by means of the diffracted light beams 102b and 104b of the first and second light beams 102a and 104a, and calculates a first displacement difference representing a difference between the predetermined position coordinate of the alignment mark stored in the memory 114a and the first position coordinate, and a second displacement difference representing a difference between the predetermined position coordinate of the alignment mark and the second position coordinate. In addition, the position correcting component 114 has a correcting component 114c, which receives the calculated first and second displacement differences and calculates a correcting value by multiplying each first and second displacement differences by first and second scaling factors, respectively, and adding and subtracting the obtained values to/from each other.

The wafer can be aligned in a precise position by moving the wafer based on the correcting value. The correcting value is determined in such a manner that the error caused by steps in a pattern forming the alignment mark can be minimized by using the difference of the position coordinates calculated by means of the first and second light beams. Accordingly, the wafer can be more precisely aligned in a predetermined position even if steps are formed in the pattern forming the alignment mark.

Figure 4:
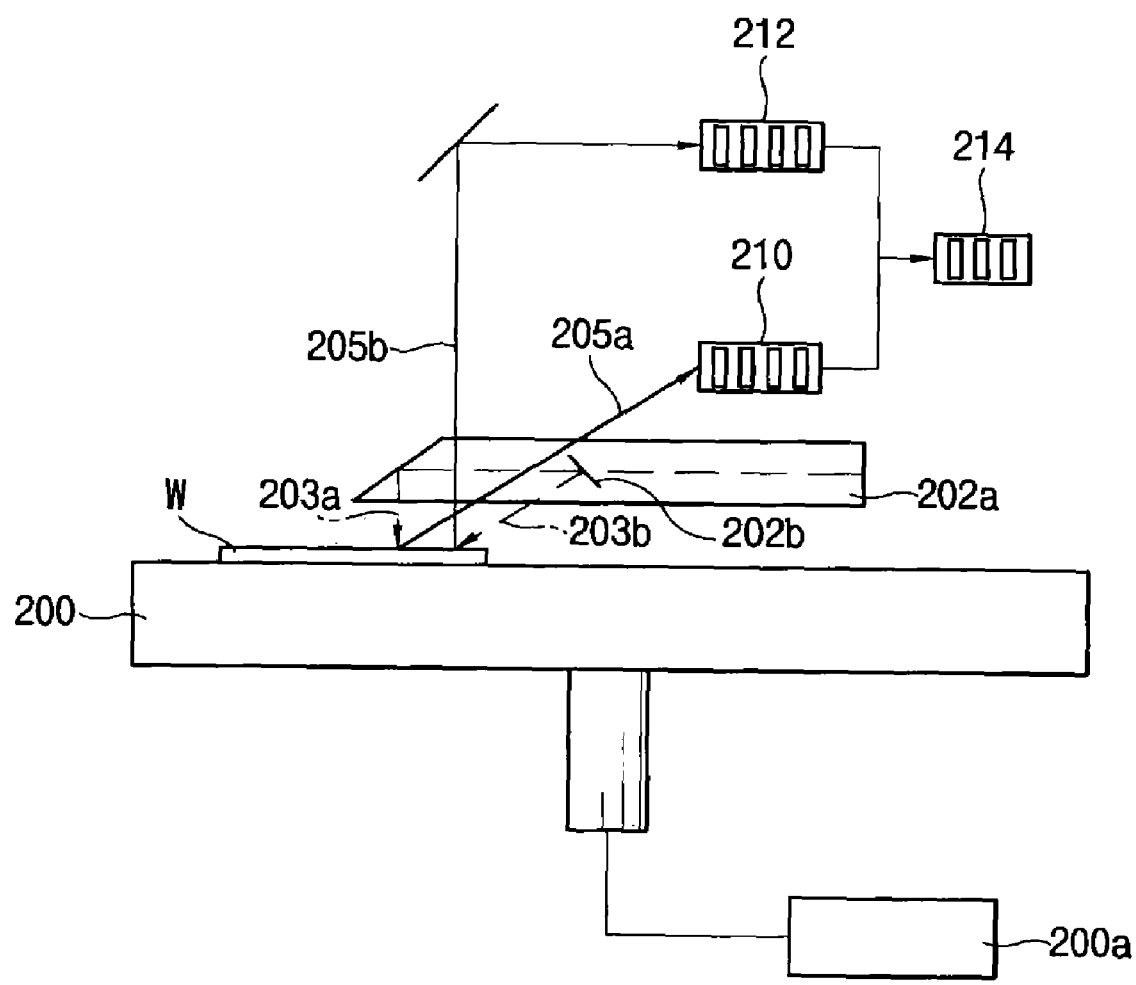
FIG. 4 is a schematic of a wafer alignment apparatus in accordance with some other embodiments of the present invention.

FIG. 4 is a schematic view of a wafer alignment apparatus according to some embodiments of the present invention. Referring now to FIG. 4, the wafer aligning apparatus comprises a stage 200, on which a wafer W is placed. The stage 200 is movable in the X, Y and Z directions by using a driving component 200a. In addition, the stage 200 may be horizontally rotated about a center of the stage 200 by the driving component 200a.

A light source component 202 is provided to radiate a first light beam 203a having a first incident angle with respect to an upper surface of the wafer W and a second light beam 203b having a second incident angle different from the first incident angle. The light source component 202 comprises one light source 202a. A beam splitter 202b is positioned in a path of the light beam radiated from the light source 202a to split the light beam into the first and second light beams 203a and 203b. The light source 202a and the beam splitter 202b are connected to a conveying component (not shown) to scan the first and second light beams 203a and 203b onto alignment marks formed in the wafer. The light source 202a and the beam splitter 202b may be positioned such that the first incident angle is a right angle.

The light source 202a may generate He—Ne, Ar, KrF, ArF, $F_2$, and X-ray light beams. The first and second light beams 203a and 203b incident onto the wafer are diffracted by the alignment marks formed in the wafer W so that the first light beam 203a and the second light beam 203b are scattered into 0 to $N_{th}$-order diffracted light forming a predetermined angle with respect to the first and second light beams 203a and 203b.

A first sensing component 210 is provided to detect a first position coordinate in the wafer, at which the first light beam 203a is diffracted, by sensing a diffracted light beam 205a derived from the first light beam 203a. A second sensing component 212 is provided to detect a second position coordinate in the wafer, at which the second light beam 203b is diffracted, by sensing a diffracted light beam 205b derived from the first light beam 203b.

A position correcting component 214 is provided to calculate a correcting value for correcting an error caused by steps formed at a surface of the wafer. The position correcting component 214 receives the first and second position coordinates measured by the first and second sensing components 210 and 212 and corrects the error by using a difference of the first and second position coordinates. The structure of the first and second sensing components 210 and 212 and the position correcting component 214 may be identical to the structure of the first and second sensing components 110 and 112 and the position correcting component 114, in accordance with some embodiments of the present invention, so they will not be further described below.

The wafer can be aligned in a precise position by moving the wafer based on the correcting value. Accordingly, the wafer can be more precisely aligned in a predetermined position even if steps are formed in the pattern forming the alignment mark.

Figure 5:
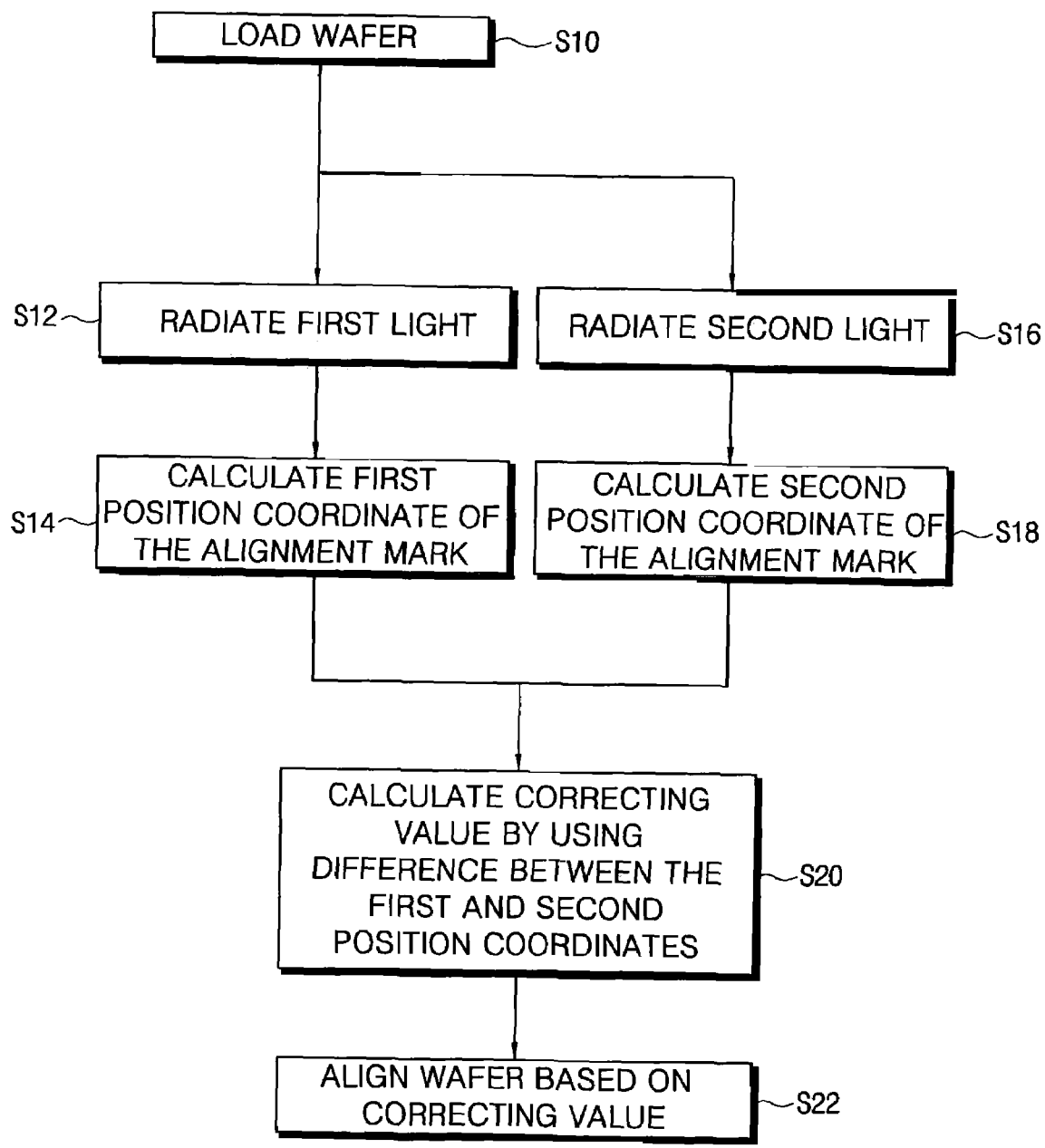
FIG. 5 is a flowchart that illustrates operations for aligning a wafer in accordance with some embodiments of the present invention.

FIG. 5 is a flowchart that illustrates methods for aligning a wafer in accordance with some embodiments of the present invention. Operations begin by loading a wafer having alignment marks formed thereon on the stage (step S10). A photoresist film is coated on a surface of the wafer. In addition, the alignment marks are formed at a lower portion of the photoresist film through exposure and etching processes. The alignment marks are positioned on a predetermined portion of scribe lines formed between chips of the wafer. The alignment marks include patterns that are spaced apart from each other by a uniform interval with a predetermined height. The pattern acts as a diffraction grating for diffracting incident light.

A first light beam is vertically radiated onto the alignment marks (step S12). The first light beam continuously scans the alignment marks formed on the wafer. The first light that is radiated onto the alignment marks is diffracted by the alignment marks so that the first light beam is scattered into 0 to $N_{th}$-order diffracted light beams forming a predetermined angle with respect to the first light beam. Assuming a spacing between the patterns of the alignment marks is d, a diffraction angle is θ, and a wavelength of first light is λ, then the diffraction angle θ satisfies a following equation.

$$d\sin\theta = n\lambda (n=0, \pm 1, \pm 2, \pm 3 \ldots )$$

A first sensor selectively senses the diffracted light beam diffracted by the wafer and a photoelectric device photoelectrically converts the diffracted light beam. In addition, the intensity of the light beam is represented as a DC signal waveform. By performing a general alignment processing algorithm with respect to the DC signal waveform, a first position coordinate, of the alignment marks is calculated (step S14).

A second light beam is radiated onto the alignment marks in a predetermined incident angle of about 0° to about 90° (step S16). The second light beam is provided to correct the error of the first position coordinate calculated by the first light beam. The second light beam is simultaneously radiated when the first light beam is radiated on the wafer. A wavelength and an incident angle of the second light beam radiated onto the alignment marks are known. The second light beam continuously scans the alignment marks formed on the wafer. A scan direction of the second light beam is identical to a scan direction of the first light beam, in accordance with some embodiments of the present invention.

A second sensor selectively senses the diffracted light beam diffracted by the wafer and a photoelectric device photoelectrically converts the diffracted light beam. In addition, the intensity of the light beam is represented as the DC signal waveform. By performing a general alignment processing algorithm with respect to the DC signal waveform, a second position coordinate of the alignment marks is calculated (step S18).

Theoretically, the same coordinate value may be obtained when the first and second position coordinates are calculated from the same alignment mark using the procedures described above. If, however, the thickness of the patterns formed in the alignment marks of the wafer is below a required thickness, or, if a step is locally generated between the alignment mark patterns, then the first position coordinate will be different from the second position coordinate and a precise value may not be calculated.

Figure 6:
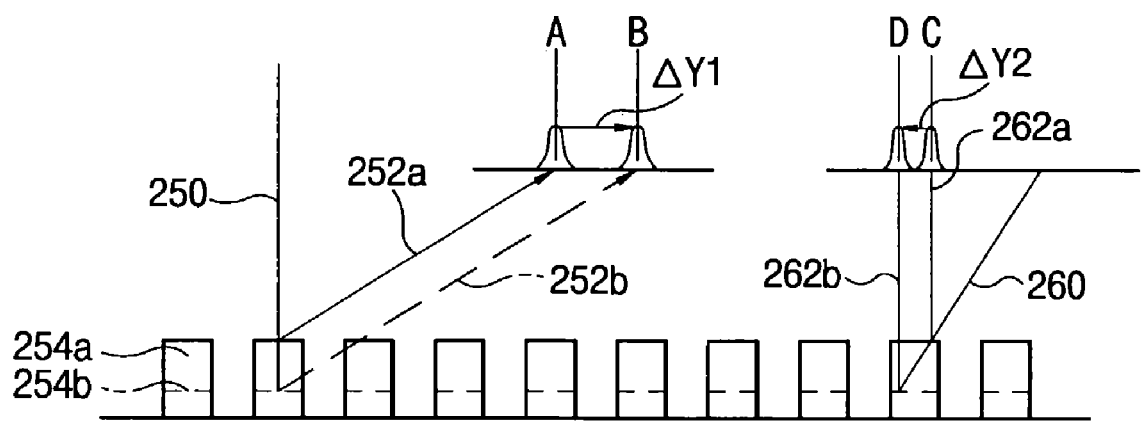
FIG. 6 is a diagram that illustrates sensing positions of diffracted light beams generated by a wafer alignment apparatus in accordance with some embodiments of the present invention.

This problem will be described in detail with reference to FIG. 6, in which the alignment marks formed in the wafer are positioned in the same coordinate, and the alignment mark patterns have different heights.

When the first light beam 250 is vertically radiated onto an alignment mark 254a having a first height, a diffracted light beam derived from the first light beam 250 is sensed at a spot A. In addition, when the first light beam 250 is vertically radiated onto an alignment mark 254b having a second height lower than the first height, a diffracted light beam derived from the first light beam 250 is sensed at a spot B, which is shifted from the spot A in a positive direction by an amount ΔY1.

When an alignment mark has a second height because it is damaged or polished through various manufacturing processes, a sensing position of the diffracted light beam is shifted in the positive direction by an amount ΔY1. Thus, the first position coordinate, which is obtained by converting the intensity of the light beam into the DC signal waveform after photoelectrically converting the sensed diffracted light beam, is shifted in the positive direction as compared to an original position of the alignment mark.

When a second light beam 260 is radiated onto the alignment mark 254a having the first height with a predetermined incident angle, the diffracted light beam 262a derived from the second light beam 260 is sensed at a spot C. In addition, when the second light beam 260 is radiated onto the alignment mark 254b having the second height with the same incident angle, the diffracted light beam 262 of the second light beam 260 is sensed at a spot D, which is shifted from the spot C in a negative direction by ΔY2.

When an alignment mark has a second height because it is damaged or polished through various manufacturing processes, a sensing position of the diffracted light beam is shifted in the negative direction by ΔY2. Thus, the second position coordinate, which is obtained by converting the intensity of the light beam into the DC signal waveform after photoelectrically converting the sensed diffracted light beam, is shifted in the negative direction as compared with an original position of the alignment mark.

By using the difference between the first and second position coordinates and predetermined position coordinates, the correcting value may be calculated, which may be used to more precisely align the wafer in a predetermined position while correcting the error caused by the steps in the alignment marks (step S20).

In short, as described above, if the height of the alignment mark is lowered, then an error may occur in the first and second position coordinates such that a first position coordinate value is different from a second position coordinate value. In addition, the sensing position of the diffracted light beam of a first light beam is shifted from a predetermined sensing position of diffracted light in a first direction. The sensing position of the diffracted light beam of a second light beam is shifted from the predetermined sensing position of the diffracted light beam in a second direction, which is different from the first direction. That is, when the heights of the alignment marks are different from each other, the sensing positions of the diffracted light beams derived from the first and second light beams are shifted in opposition to each other about the predetermined sensing position of the diffracted light beams. This error may be corrected by using the correcting value described above.

Methods for correcting the alignment error caused by steps in the alignment marks, in accordance with some embodiments of the present invention, will now be described. A first displacement difference is determined as a difference between the predetermined position coordinate of the alignment mark and the first position coordinate obtained by the first light beam. Then, a second displacement difference is provided as a difference between the predetermined position coordinate of the alignment mark and the second position coordinate obtained by the second light beam. Thereafter, first and second scaling factors are applied to the first and second displacement differences and then these products are summed so as to obtain the correcting value.

Methods for obtaining the first and second scaling factors, in accordance with some embodiments of the present invention, will now be described. First position coordinate values obtained by the first light beam are calculated according to the height of the alignment marks. If the height of the alignment marks has been lowered, the first position coordinates are shifted in the first direction from the predetermined position coordinates of the alignment marks, so the first position coordinate values are obtained from the first position coordinates shifted from the predetermined position coordinates of the alignment marks. Shifting degrees of the first position coordinates in the first direction according to the height of the patterns formed in the alignment marks are represented as numerical values.

Second position coordinate values obtained by the second light beams are calculated according to the height of the alignment marks. Because second position coordinate values vary depending on the incident angle of the second light beam with respect to the alignment marks, the incident angle of the second light beam has been selected to be about 0° to about 90° with respect to the upper surface of the wafer. If the height of the alignment marks has been lowered, the second position coordinates are shifted from the predetermined position coordinates of the alignment marks in the second direction, which is different from the first direction, so the second position coordinate values are obtained from the second position coordinates shifted from the predetermined position coordinates of the alignment marks. Shifting degrees of the first position coordinates in the second direction according to the height of the patterns formed in the alignment marks are represented as numerical values.

Figure 7:
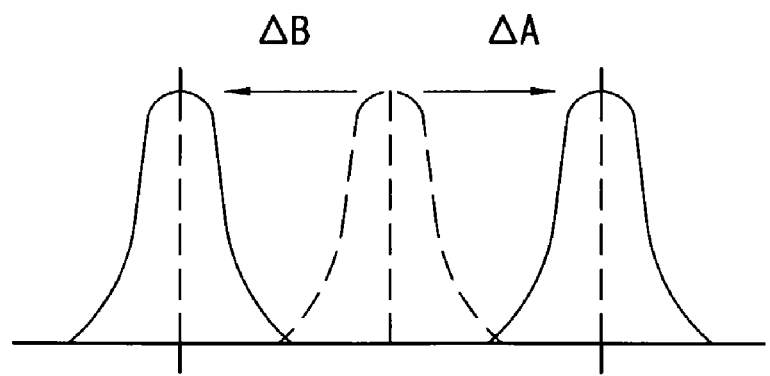
FIG. 7 is a diagram that illustrates diffracted light beam displacements that result from step differences in alignment marks in accordance with some embodiments of the present invention.

If the patterns formed in the alignment marks have the same height, parameter values, which are applied to a first displacement value ΔA shifted in the first direction and a second displacement value ΔB shifted in the second direction to sum to a value of "0," are calculated (see FIG. 7). A parameter value multiplied by the first displacement value ΔA becomes a first scaling factor, and a parameter value multiplied by the second displacement value ΔB becomes a second scaling factor. When the steps formed in the patterns vary, but the patterns of the alignment marks maintain their positions, a total displacement value obtained by adding the first displacement value to the second displacement value by applying the first and second scaling factors thereto is "0."

Therefore, a relatively precise correcting value can be obtained even if the error occurs in the position coordinates due to the steps of the alignment marks. Even when the height of the alignment marks is lowered to the same height, the shifting degrees of the first and second position coordinates are different from each other, so the first and second scaling factors have different values, respectively.

Returning to FIG. 5, the wafer is aligned based on the correcting value, which is obtained through applying the first and second scaling factors to the first and second displacement differences and adding up the first and second displacement differences (step S22). By using the correcting value obtained through the above method, the wafer can be aligned in the predetermined position while reducing the error caused by the steps formed in the patterns of the alignment marks.

According to the alignment methods described above, in accordance with some embodiments of the present invention, a wafer can be more precisely aligned in a predetermined position by obtaining a correcting value for correcting the error, even if the steps are formed in the patterns of the alignment marks at each area of the wafer. Precise position coordinates of the alignment marks can be obtained even if the steps are formed in the patterns of the alignment marks at each area of the wafer, or even if the height of the patterns is unevenly formed due to the damage to the alignment marks. Accordingly, an alignment error of the wafer caused by an inaccurate measurement of the position coordinates can be prevented, which may allow the wafer to be more precisely aligned in a predetermined position. It may therefore be possible to reduce failures when performing a photolithographic process where the alignment of the wafer is important. Accordingly, the productivity and reliability of a semiconductor device may be improved.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A method for aligning a wafer, comprising:
   providing a wafer having alignment marks formed thereon;
   radiating a first light beam onto the alignment marks so as to generate a first diffracted light beam;
   sensing the first diffracted light beam at a first position;
   radiating a second light beam onto the alignment marks so as to generate a second diffracted light beam;
   sensing the second diffracted light beam at a second position;
   calculating a correction value for aligning the wafer based on a first difference between the first position and a first predetermined position and a second difference between the second position and a second predetermined position; and
   aligning the wafer based on the correction value.

2. The method of claim 1, wherein radiating the first light beam comprises vertically radiating the first light beam onto the wafer.

3. The method of claim 1, wherein radiating the second light beam comprises radiating the second light beam at an incident angle of about 0° to about 90° with respect to the wafer.

4. The method of claim 1, wherein calculating the correction value comprises:
   determining first and second scaling factors;
   multiplying the first difference by the first scaling factor to generate a first product;
   multiplying the second difference by the second scaling factor to generate a second product; and
   adding the first and second products.

5. The method of claim 4, wherein determining the first and second scaling factors comprises:
   calculating respective values for the first and second scaling factors such that adding the first and second products results in a value of zero when the alignment marks are substantially the same height.

6. The method of claim 1, wherein radiating the first light beam comprises:
moving the first light beam along the alignment marks.

7. The method of claim 1, wherein radiating the second light beam comprises:
moving the second light beam along the alignment marks in a same direction that the first light beam is moved along the alignment marks.

8. The method of claim 1, wherein the first light beam comprises at least one of an He—Ne, Ar, KrF, ArF, $F_2$, and X-ray light beam.

9. The method of claim 1, wherein the second light beam comprises at least one of an He—Ne, Ar, KrF, ArF, $F_2$, and X-ray light beam.

10. An apparatus for aligning a wafer, comprising:
a stage that is configured to hold a wafer with alignment marks;
a light source component that is configured to radiate a first light beam onto the alignment marks so as to generate a first diffracted light beam and to radiate a second light beam onto the alignment marks so as to generate a second diffracted light beam;
a first sensing component that is configured to sense the first diffracted light beam at a first-position;
a second sensing component that is configured to sense the second diffracted light beam at a second position; and
a position correcting component that is configured to calculate a correction value for aligning the wafer based on a first difference between the first position and a first predetermined position and a second difference between the second position and a second predetermined position.

11. The apparatus of claim 10, wherein the light source component is configured to vertically radiate the first light beam.

12. The apparatus of claim 10, wherein the light source component is configured to radiate the second light beam at an incident angle of about 0° to about 90° with respect to the wafer.

13. The apparatus of claim 10, wherein the light source component comprises:
a light source that is configured to generate a light beam; and
a beam splitter that is configured to generate the first and second light beams responsive to the light beam.

14. The apparatus of claim 10, wherein the light source and the beam splitter are connected to a conveying component, which is operable to move the light source and the beam splitter parallel to the wafer.

15. The apparatus of claim 10, wherein the light source component comprises:
a first light source that is configured to generate the first light beam; and
a second light source that is configured to generate the second light beam.

16. The apparatus of claim 15, wherein the first light source and the second light source are connected to a conveying component, which is operable to move the first and second light sources parallel to the wafer.

17. The apparatus of claim 10, wherein the position correcting component comprises:
a memory that is configured to store the first and second predetermined positions;
a displacement difference calculating component that is configured to calculate the first difference and the second difference; and
a correction value calculating component that is configured to determine first and second scaling factors, multiply the first difference by the first scaling factor to generate a first product; multiply the second difference by the second scaling factor to generate a second product, and add the first and second products.

18. The apparatus of claim 10, wherein the first light beam comprises at least one of an He—Ne, Ar, KrF, ArF, $F_2$, and X-ray light beam.

19. The apparatus of claim 10, wherein the second light beam comprises at least one of an He—Ne, Ar, KrF, ArF, $F_2$, and X-ray light beam.

20. The apparatus of claim 10, wherein the first sensing component comprises:
a sensor that is configured to sense the first diffracted light beam at the first position;
a photoelectric device that is configured to photoelectrically convert the first diffracted light beam sensed by the sensor to an electrical signal;
a calculating component that is configured to calculate the first position responsive to the electrical signal.

21. The apparatus of claim 10, wherein the second sensing component comprises:
a sensor that is configured to sense the second diffracted light beam at the second position;
a photoelectric device that is configured to photoelectrically convert the second diffracted light beam sensed by the sensor to an electrical signal;
a calculating component that is configured to calculate the second position responsive to the electrical signal.

* * * * *